United States Patent
Ward et al.

[11] Patent Number: 5,897,715
[45] Date of Patent: Apr. 27, 1999

[54] INTERDIGITATED PHOTOVOLTAIC POWER CONVERSION DEVICE

[75] Inventors: James Scott Ward, Englewood; Mark Woodbury Wanlass, Golden; Timothy Arthur Gessert, Conifer, all of Colo.

[73] Assignee: Midwest Research Institute, Kansas City, Mo.

[21] Appl. No.: 08/858,422

[22] Filed: May 19, 1997

[51] Int. Cl.$^6$ ................................. H01L 31/042
[52] U.S. Cl. ............ 136/244; 136/249; 136/253; 136/256
[58] Field of Search ............. 136/244, 249 MS, 136/253, 256

[56] References Cited

U.S. PATENT DOCUMENTS

| | | | |
|---|---|---|---|
| 4,361,717 | 11/1982 | Gilmore et al. | 136/246 |
| 4,746,620 | 5/1988 | Diadiuk et al. | 437/3 |
| 4,838,952 | 6/1989 | Dill et al. | 136/256 |
| 4,865,999 | 9/1989 | Xi et al. | 437/2 |
| 4,933,021 | 6/1990 | Swanson | 136/249 |
| 5,164,019 | 11/1992 | Sinton | 136/249 |

OTHER PUBLICATIONS

"P/N In(Al)GaAs Multijunction Laser Power Converters" by S. Wojtczuk & T. Parados of Spire Corp. and G. Walker of NASA Langley Rsch. Center. 1992.

"InGaAs PV Device Development for TPV Power Systems" by D. Wilt, et. al., NASA Lewis Rsch. Center; American Institute of Physics, 1995.

"Monolithic Series–Connected Gallium Arsenide Converter Development" by M. Spitzer, et. al., Kopin Corp. & B. Rose of Sandia Nat'l Labs, 1991.

*Primary Examiner*—Mark Chapman
*Attorney, Agent, or Firm*—Ken Richardson

[57] ABSTRACT

A photovoltaic power conversion device has a top surface adapted to receive impinging radiation. The device includes at least two adjacent, serially connected cells. Each cell includes a semi-insulating substrate and a lateral conductivity layer of a first doped electrical conductivity disposed on the substrate. A base layer is disposed on the lateral conductivity layer and has the same electrical charge conductivity thereof. An emitter layer of a second doped electrical conductivity of opposite electrical charge is disposed on the base layer and forms a p-n junction therebetween. A plurality of spaced channels are formed in the emitter and base layers to expose the lateral conductivity layer at the bottoms thereof. A front contact grid is positioned on the top surface of the emitter layer of each cell. A first current collector is positioned along one outside edge of at least one first cell. A back contact grid is positioned in the channels at the top surface of the device for engagement with the lateral conductivity layer. A second current collector is positioned along at least one outside edge of at least one oppositely disposed second cell. Finally, an interdigitation mechanism is provided for serially connecting the front contact grid of one cell to the back contact grid of an adjacent cell at the top surface of the device.

27 Claims, 7 Drawing Sheets

INTERDIGITATED PHOTOVOLTAIC POWER CONVERSION DEVICE

CONTRACT ORIGIN OF THE INVENTION

The United States Government has rights in this invention pursuant to Contract No. DE-AC-36-83CH10093 between the United States Department of Energy and the National Renewable Energy Laboratory, a division of the Midwest Research Institute.

BACKGROUND OF THE INVENTION

1. Field of the Invention

This invention relates generally to monolithic series-connected solar cells and, more particularly, to interdigitated thermophotovoltaic power converters. Specifically, the present invention relates to an improved front-back interdigitated contact arrangement for use in such monolithic series-connected power converter devices.

2. Description of the Prior Art

In general, a semiconductor solar cell includes a plurality of p and n conductivity-type regions in a semiconductor body. These regions generate a voltage potential and/or a current when electron-hole pairs are created in the semiconductor body in response to impinging radiation on the top or emitter layer. When this occurs, the holes and electrons migrate, respectively, to p-doped and n-doped regions. Because of the typical small voltage generated for each cell, for example 0.5 to 0.8 volts open circuit for a silicon concentrator cell, such cells are serially connected to achieve higher operating voltages. In monolithic structures where the cells share a common substrate, electrical isolation as well as serial connection of the individual cells must be provided.

Thermophotovoltaic (TPV) systems convert radiant energy and infrared light energy from a heat source into electricity in much the same manner as a traditional solar cell converts visible light from the sun into electricity. Since the energy spectrum emitted from a heat source is dependent on the temperature of the source, and since these temperatures are generally much lower than the temperature of the sun, thermophotovoltaic converters must use semiconductors with band gaps that are much smaller than those traditionally used for solar cells. The low band-gaps of the TPV converter insures that the voltage generated by individual discrete devices is typically less than approximately 0.5 volts. Additionally, the close proximity of the converter to the radiant energy source with its high flux density, results in the generation of extremely high current densities in such converters. These high current densities combine with low voltage outputs to cause a large fraction of the generated power to be dissipated by resistance losses in the front surface metallization of the converter. Since the generated current scales with the area of the device, these parasitic power losses result in a practical upper limit for the size of an individual discrete device of around 1 $cm^2$. Because many proposed thermophotovoltaic applications envision a relatively large area converter array, the practical considerations associated with considering such an array with 1 $cm^2$ individual devices provide incentive for developing monolithic integrated circuits for these devices that will allow an entire wafer to be processed into a single component. Additionally, the proposed array is fabricated on a semi-insulating substrate facilitating incorporation of an effective back surface reflector, which is a necessary element of an efficient thermophotovoltaic system.

All of the current approaches to the fabrication of monolithically interconnected thermophotovoltaic converters share a common design element. They assume the active device layers are grown epitaxially on a semi-insulating substrate, commonly in InP. The purpose of the semi-insulating substrate is two-fold. First it allows for the electrical isolation of the individual discrete devices, that is isolation in individual cells on the device. Secondly, the lack of free-carriers in the substrate should facilitate the incorporation of an effective back-surface reflector. Since the front and back contact metallization is required to be located on the front or top surface of the cell due to the back surface reflector layer, the metallization utilized for such front-back contacts tends to reduce the amount of surface area available for exposure to impinging radiation. Such front-back contact structures on the top surface of the device are also applicable to general solar photovoltaic cells to permit easy mounting of such cells into a device. Heretofore, a number of monolithic solar cell configurations having front-back contact arrangements have been designed. Some examples of such devices are illustrated in U.S. Pat. Nos. 4,865,999 and No. 4,933,021. Typical solar cell configuration includes contacts disposed on the back surface of the cell without a back surface reflector layer such as illustrated in U.S. Pat. No. 4,838,952. To date, front-back contact arrangements for photovoltaic converters have provided inadequate performance for high current operation especially when utilizing devices having lattice-mismatched compositions due to series resistance losses from the contact structure. Consequently, there is still a need for a photovoltaic power conversation device which includes an interdigitated front-back contact arrangement that provides high efficiencies and low series resistance in the cell.

SUMMARY OF THE INVENTION

It is, therefore, one object of the present invention to provide an improved photovoltaic power conversion device.

It is another object of the present invention to provide a monolithically integrated thermophotovoltaic power conversation module having reduced series resistance losses.

Yet another object of the present invention is to provide an improved photovoltaic power conversation device having an improved interdigitated front-back contact arrangement having less metallization and less "dead" interconnect space.

Still another object of the present invention is to provide an interdigitated interconnect structure for a thermnophotovoltaic cell with increased power density output.

To achieve the foregoing and other objects and in accordance with the purpose of the present invention, as embodied and broadly described herein, a photovoltaic power conversion device has a top surface adapted to receive impinging radiation. The device includes at least two adjacent, serially connected cells. Each cell includes a semi-insulating substrate with a lateral conductivity layer of a first doped electrical conductivity disposed on the substrate. A base layer is disposed on the lateral conductivity layer and has the same electrical conductivity thereof. An emitter layer of a second doped electrical conductivity of opposite electrical charge is disposed on the base layer and forms a p-n junction therebetween. A plurality of spaced channels are formed in the emitter and base layers to expose the lateral conductivity layer at the bottoms thereof. A front contact grid is positioned on the top surface of the emitter layer of each cell, and a first current collector is positioned along one outside edge of at least one first cell. A back contact grid is positioned in the channels at the top surface of the device for engagement with the lateral conductivity layer. A second current collector is positioned along at least one outside edge of at least one oppositely disposed second cell. Finally, an interdigitation mechanism is provided for serially connecting the front contact grid of one cell to the back contact grid of an adjacent cell at the top surface of the device.

BRIEF DESCRIPTION OF THE DRAWINGS

The accompanying drawings which are incorporated in and form a part of the specification illustrate preferred embodiments of the present invention and, together with a description, serve to explain the principles of the invention. In the drawings.

DETAILED DESCRIPTION OF THE PREFERRED EMBODIMENT

As previously discussed, thermophotovoltaic (TPV) systems convert radiant energy from a heated element into electrical energy the way that a solar photovoltaic cell converts solar energy into electrical energy. TPV cells employ low-band-gap photovoltaic devices in close proximity to the emitter in order to perform this conversion. The low-band-gap of the converter, i.e. 0.74–0.55 eV, generally ensures that the voltage generated by the individual discrete devices is typically less than about 0.5 eV. Additionally, the close proximity to the emitter, with its high flux density, results in extremely high current densities generated in such converters. These facts combine to cause a large fraction of the generated power to be dissipated by resistance losses in the front surface metal contact structures of typical prior art converters. Because many proposed TPV applications envision a relatively large area converter array, monolithic integrated circuits of these relatively small (1 cm$^2$) devices will allow an entire wafer to be processed into a single component. Additionally, such a TPV array is preferably fabricated on a semi-insulating substrate which facilitates the incorporation of an effective back-surface reflector, a necessary element of an efficient TPV system.

Figure 1:
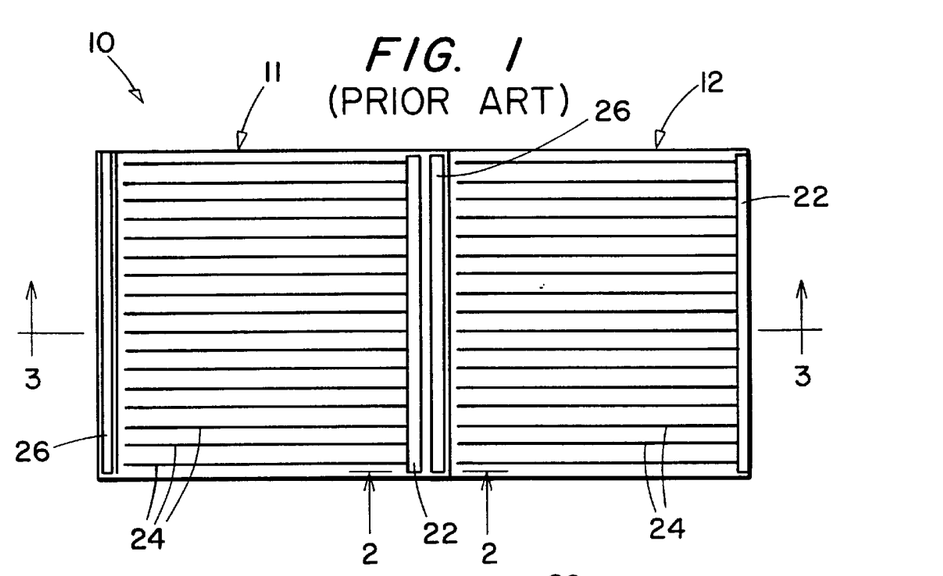
FIG. 1 is a top plan view of a pair of thermophotovoltaic cells illustrating a prior art interdigitated front-back contact structure.
Figure 2:
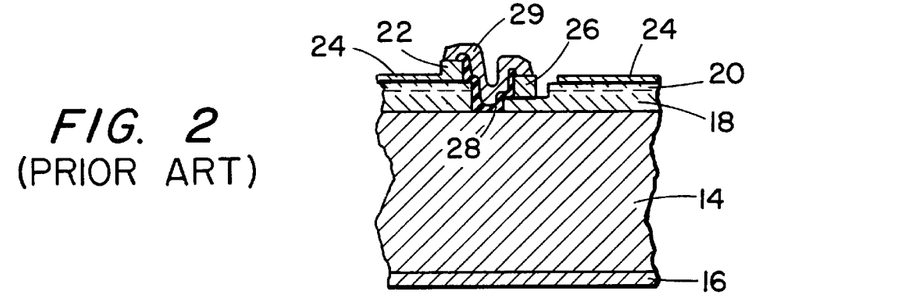
FIG. 2 is a cross-sectional view taken substantially along line 2—2 of the prior art FIG. 1 structure.
Figure 3:
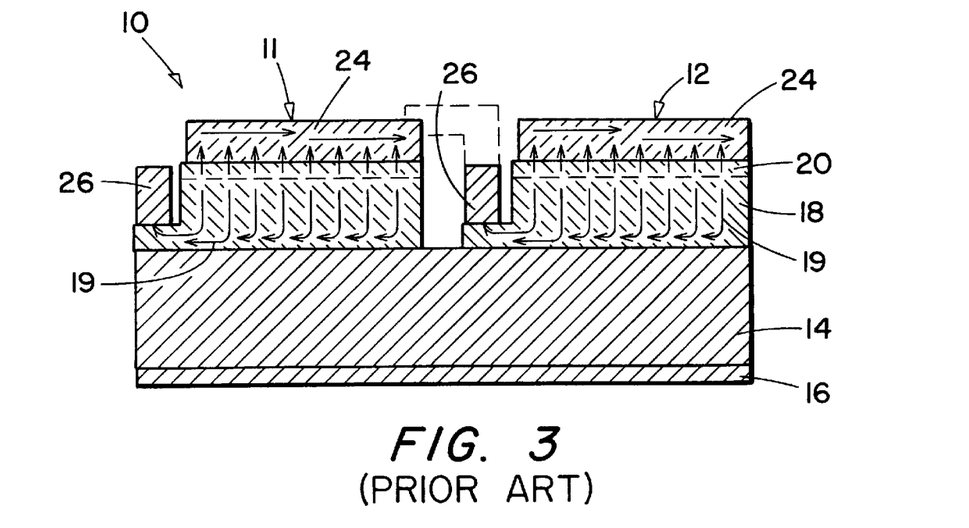
FIG. 3 is a cross-sectional view taken substantially along line 3—3 of the prior art FIG. 1 structure.

Referring first to FIGS. 1–3 which illustrate typical prior art devices, monolithic interconnected power conversion devices have been investigated for a number of years for various different applications. Prior approaches for the fabrication of monolithically interconnected GaInAs TPV converters share a common design element. As illustrated in FIGS. 1–3, a converter 10 includes individual cells 11 and 12 which are grown on a semiinsulating substrate layer 14 and a back-reflecting layer 16. The cells 11 and 12 include a back contact layer 18, preferably doped with an n-type dopant, and an emitter layer 20 doped with preferably a p-type dopant. Since the back surface of the cells 11 and 12 comprise a back-surface reflector layer 16, both the front and back metallic contact structures must occur on the top surface of the cells 11 and 12.

To this effect, current collection on the top surface of the cells 11 and 12 is facilitated by a conventional metal grid structure. The conventional metal grid structure for the front contact includes a current collector or bus bar 22 and a plurality of metal fingers 24 which are spaced from each other in a substantially parallel fashion and connected to the current collector bar 22. Since the fingers 24 are spaced very closely together as illustrated in FIG. 1, the resistance loss associated with the current spreading laterally through the emitter layer 20 is minimal. However, the current flow through the back contact layer 18 is far more problematic. In this particular instance, the current as illustrated by the arrows 19 in FIG. 3 is required to flow the entire width of the cells 11 and 12, respectively, through the semiconductor material of the layer 18 to the back contact current collector 26. Consequently, the width of the cells 11 or 12 must remain at approximately 250 μm maximum dimension in order to avoid excessive series resistance losses due to the necessity of the current 19 having to pass through the entire length of the back contact layer 18.

Referring particularly to FIG. 2, such prior art devices include an interdigitated connection structure by first providing an insulating layer 28 between the front contact current collector 22 and the back contact current collector 26. Then, a metallization layer 29 is layered over the insulation layer 28 and interconnects the front contact current collector 22 of cell 11 to the back contact current collector 26 of the cell 12. This interconnect structure provides a dead area in the upper surface of the structure since radiation impinging on the upper surface of the structure will not pass through the metallization into the semiconductor layers 20, 18 and 14. Due to the limitation of the cell width as a result of the series resistance limitations discussed above, the interconnect width illustrated by the interdigitation structure of FIG. 2 takes up an unacceptably large fraction of the converter area. This means that for every 250 μm of active converter width, there is approximately 100 μm of "dead" interconnect area, approximately 40%. The net effect of this prior art structure is that the material parameters, that is the sheet resistance of the base layer, are dictating the output (current and voltage) of the device and thereby limiting it.

The present invention is directed to an improved front-back interdigitated contact arrangement between cells of a photovoltaic converter which eliminates the disadvantages of the previous designs as discussed above. Referring with particularity, now, to FIGS. 4–7, a monolithic photovoltaic power conversion device 30 includes a plurality of individual photovoltaic cells 32 that are preferably grown or formed on a single semi-insulating substrate 33 and are interdigitally connected in series, the converter having a positive contact 35 and negative contact 37.

Figure 4:
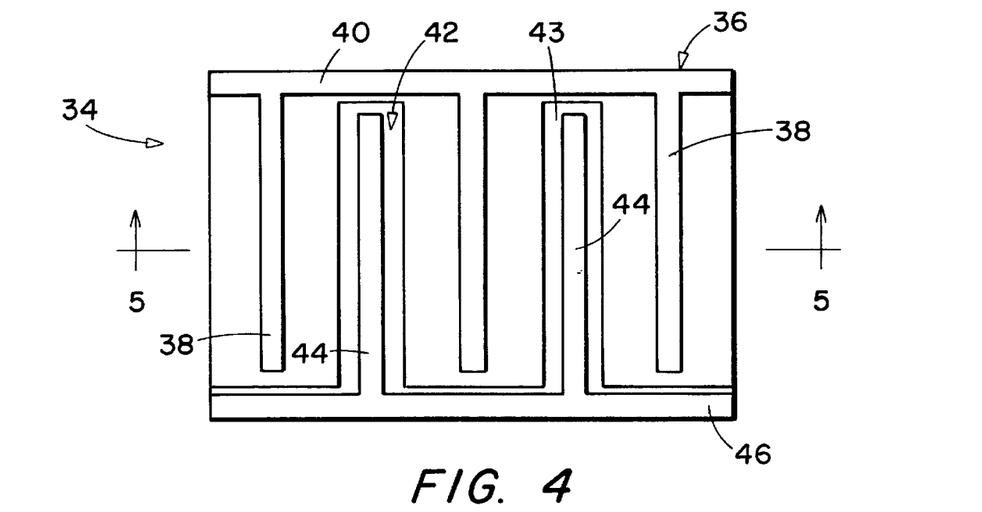
FIG. 4 is a top plan view of a first embodiment of the present invention illustrating the interdigitated front-back contact structure of the present invention;.
Figure 5:
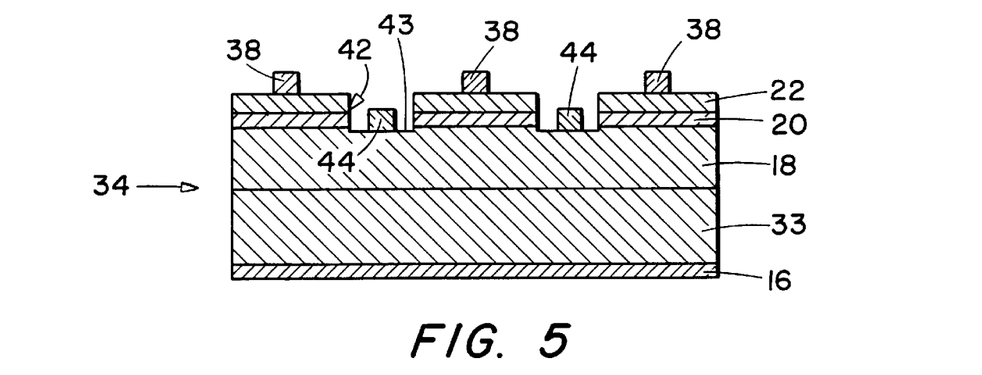
FIG. 5 is a cross-sectional view taken substantially along line 5—5 of FIG. 4.

More specifically, a single cell 34 includes the semi-insulating substrate layer 33, which in preferred form is InP, although any semi-insulating substrate material known to the art may be utilized. When the device 30 is to be a thermophotovoltaic cell, then the back surface reflective layer 16 is preferably included on the bottom portion of the semi-insulating layer 33, and in one form may be $SiO_2$/Ag. As previously discussed, this back surface reflector layer 16 is necessary for a thermophotovoltaic converter to provide a means of sending energy back to the thermal source to be recycled. One difficulty with this approach in utilizing a back surface reflector is the absorption of this returned energy by free carriers in the substrate layer 33 upon which device structure is grown. Free carriers do need to be present in the substrate 33 in order to form a back contact, although too thick of a layer 33 will absorb too much energy thereby overheating the device. As a result, thermophotovoltaic structures utilized in the present invention preferably incorporate a semi-insulating substrate as the substrate layer 33.

The lateral conductivity layer or back contact layer 18 is deposited on the semi-insulating substrate 33 and is either positive or negative charged dependent upon the dopant utilized. In preferred form, the back contact layer 18 is doped with an n-type dopant. The base layer 20 is then deposited on the contact layer 18 and carries the same electrical charge thereof. Finally, the emitter layer 22 is deposited on the base layer 20 and has an opposite electrical charge of the base layer 20 by utilizing a different dopant. In the preferred form, the emitter layer is a p-type dopant layer. A p-n junction, then, is formed between the emitter layer 22 and the base layer 20. The materials utilized for the lateral conductivity layer 18, the base layer 20 and the emitter layer 22 may be selected from any of the semiconductor materials well known in the photovoltaic art, for the interdigitation contact structure of the present invention is not limited to any particular material combination. For example, any materials selected from Groups III–V, such as GaInAs, InP, and the like, may be utilized.

Figure 6:
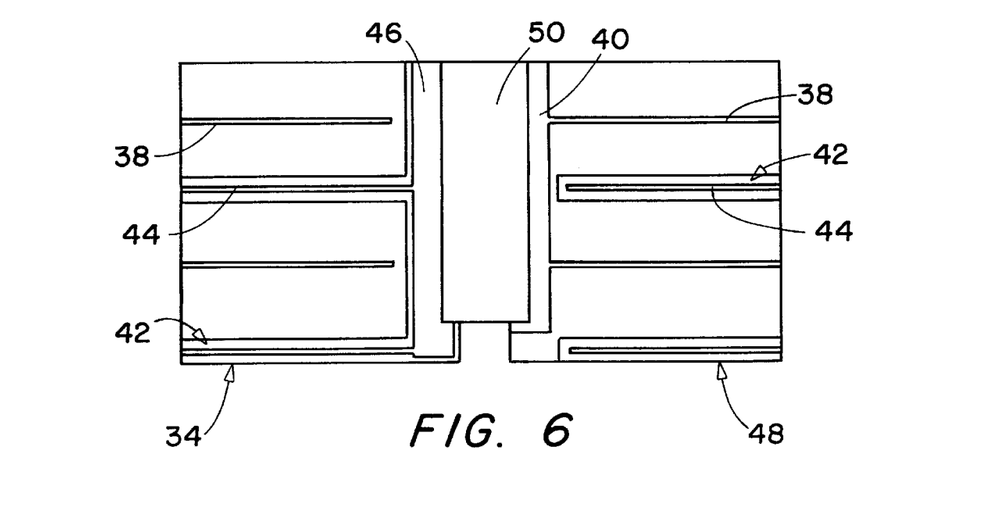
FIG. 6 is a partial, top plan view illustrating the portion of the interconnect structure between two cells having an interdigitated front-back contact structure similar to that illustrated in FIGS. 3 & 4.
Figure 7:
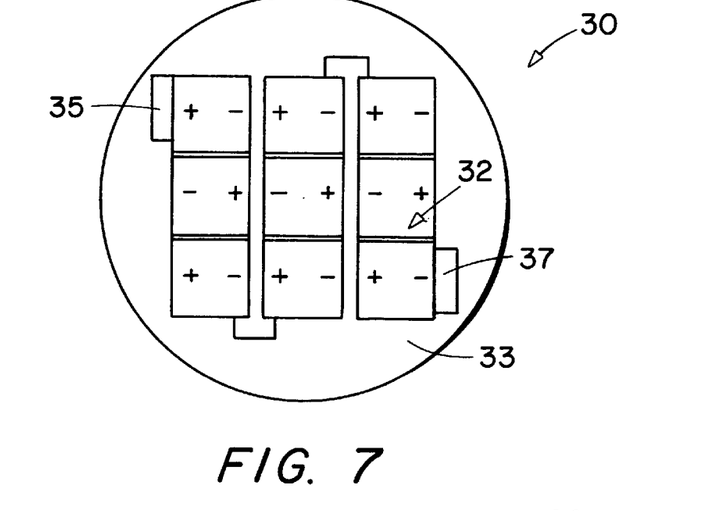
FIG. 7 is a top plan view of a thermophotovoltaic power conversion device having nine cells interconnected in accordance with the present invention.

Once it was discovered that the functional limitations of the prior interdigitation approaches were due to the fact that the current flow through the back contact layer created high resistance losses, it was discovered that a back contact grid arrangement similar to the front contact grid arrangement would prevent and eliminate this problem. Referring in particular to FIGS. 4–6, the first individual cell 34 includes a front contact grid arrangement 36. The front contact grid structure 36 includes a plurality of front contact grid fingers 38 that are spaced apart and substantially parallel to each other and which interconnect to a front contact current collector bar 40. In preferred form, the fingers 38 are substantially perpendicular to the current collector bar 40, and the fingers 38 and current collector bar 40 may be selected from any appropriate metallic material that has a high electrical conductivity. The grid fingers 38 and the collector 40 are deposited on the top surface of the emitter layer 22 so as to be in intimate contact therewith. In addition, the current collector bar 40 is preferably disposed along one side edge of the cell 34.

To provide a back contact grid on the upper surface of the cell 34, a plurality of channels 42 are formed in the upper surface of the cell 34 through the emitter layer 22 and the base layer 20 so as to expose the lateral conductivity layer 18 or back contact layer 18 at the bottoms 43 of the channels 42. The channels or vias (viaducts) 42 may be formed in any desired manner and are preferably formed by etching techniques that provide narrow but well defined channels 42. The channels 42 are formed in a spaced manner interposed between the fingers 38 and preferably in substantially parallel fashion thereto. A plurality of back contact grid fingers 44 that are similar in size and material to the front contact grid fingers 38 are positioned in the channels 42 so as to contact the lateral conductivity layer 18 at the bottom 43 thereof. The back contact grid fingers 44 are preferably spaced in one form alternating with the front contact fingers 38 in substantially parallel fashion and are interconnected to a back contact current collector 46 which is substantially perpendicular to the fingers 44. In preferred form, the back contact current collector bar 46 is disposed along a side edge of the cell 34 opposite from the front contact current collector bar 40, so that each cell 34 includes a current collector bar of one electrical charge on one side edge thereof and a current collector bar of an opposite electrical charge on the opposite edge thereof. In preferred form, the front contact grid fingers 38 and the back contact grid fingers 44 are maintained substantially narrow in width so as to reduce the amount of metal at the upper surface of the cell 34 and therefore provide as much active area as possible for receiving radiation.

The individual cells 32 are interdigitally interconnected for positioning a first cell 34 immediately adjacent a second cell 48, as illustrated in FIG. 6. The second cell 48 includes a front-back contact grid structure substantially identical to that of the first cell 34. The first cell 34 is arranged such that the front contact current collector 40 thereof is spaced immediately adjacent from the back contact current collector 46 of the cell 48. A bridge interconnect member 50 is then positioned to contact and electrically connect the front contact current collector 40 with the back contact current collector 46 so as to bridge the first cell 34 with the second cell 48 and to electrically interconnect the cell 34 with the cell 48 in series. In this manner, the majority of the surface area of each cell 34 and 48 remains exposed to receive impinging radiation.

Figure 11:
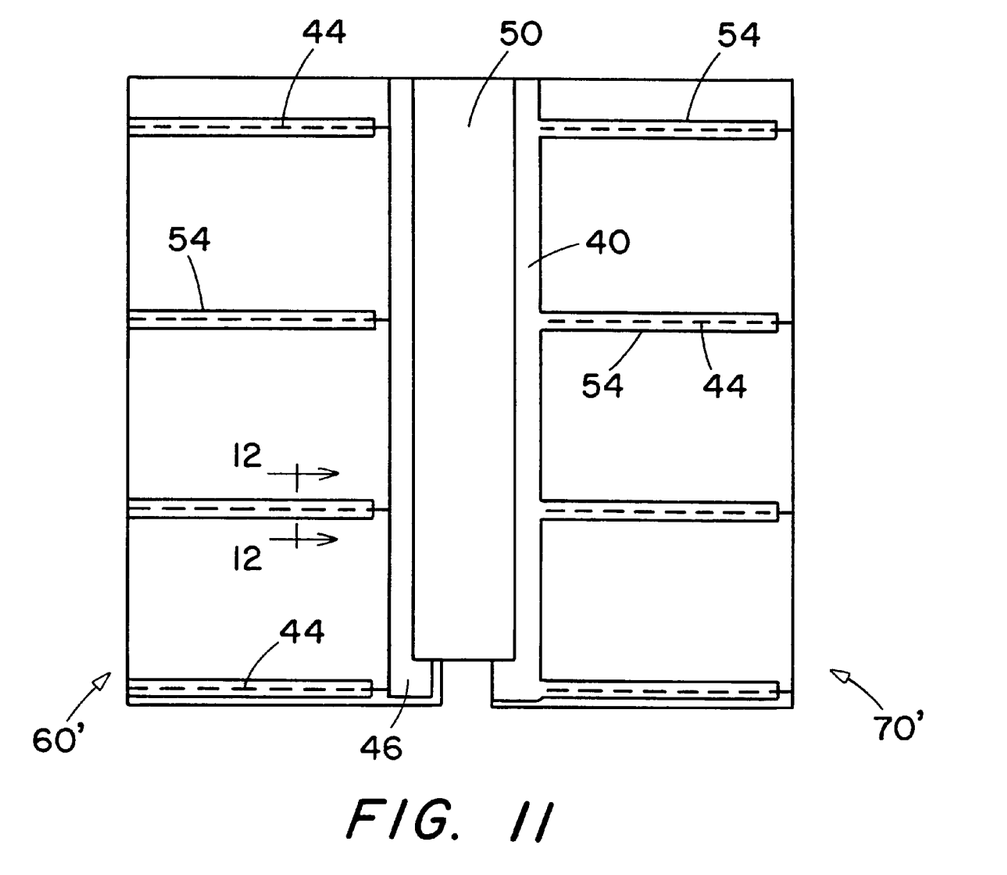
FIG. 11 is a top plan view of an interconnect structure illustrating yet a further embodiment of the front-back interdigitated contact structure of the present invention.
Figure 12:
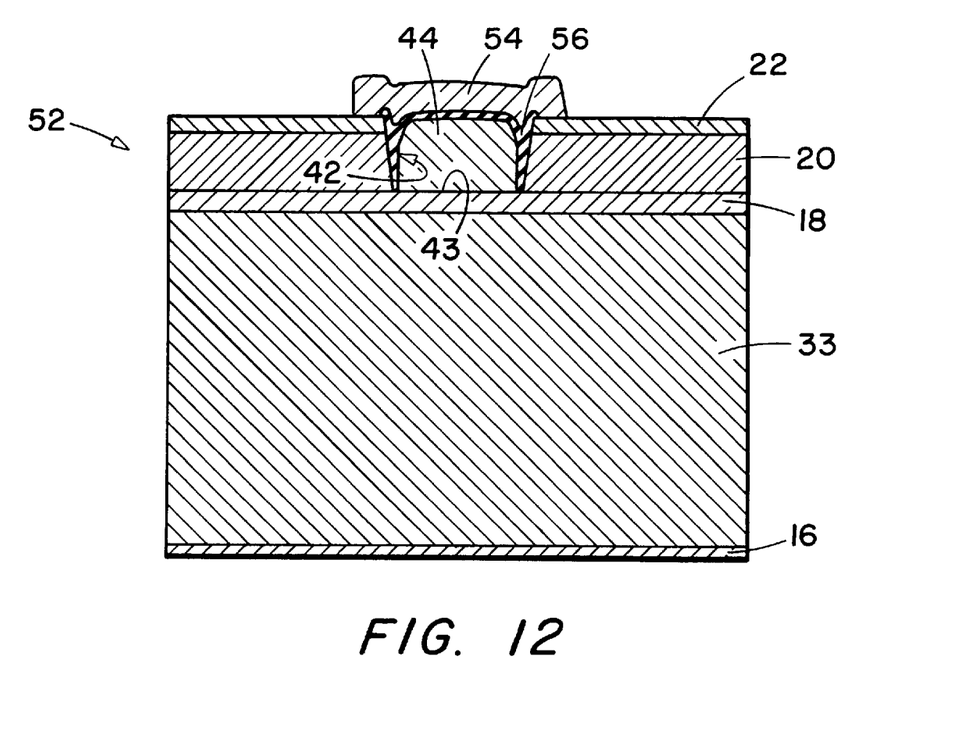
FIG. 12 is a cross-sectional view taken substantially along line 12—12 of FIG. 11 illustrating the stacked contact arrangement of this particular embodiment.

Referring now to FIGS. 11 and 12, an alternate embodiment to the front-back interdigitated contact arrangement previously described is illustrated. In this embodiment, a cell 52 includes the semi-insulating substrate 33, the back reflecting layer 16, the contact layer 18, the base layer 20 and the emitter layer 22 similar to that of the prior embodiment. Moreover, in this embodiment a plurality of channels 42 are likewise formed in the upper surface of the cell 52 through the layers 22 and 20 so as to expose the lateral conductivity layer or back contact layer 18 at the bottom surface 43 thereof. Similar to the previous embodiment, the back contact fingers 44 are positioned within the channels 42. However, in order to increase the amount of surface area of the cell 52 exposed to impinging radiation, the front contact grid fingers 54 are arranged immediately above the back contact grid fingers 44. The front contact grid fingers 54 are spaced from each other as in the prior embodiment and are interconnected to a front contact current collector 40. Likewise, the back contact grid fingers 44 are also spaced in substantially parallel fashion and are interconnected to a back contact current collector 46. In this embodiment, however, the front contact grid fingers 54 are wider that in the prior embodiment and bridge the channels 42 so as to engage the top surface of the emitter layer 22 on each side of the channel 42. A layer of insulation 56 is preferably positioned between the front contact fingers 54 and the back contact fingers 44 so as to prevent contact therebetween and shorting of the cell. In this particular embodiment, the bridge interconnect member 50 is likewise utilized to interconnect adjacent cells as previously described. The only difference in this particular embodiment is the stacking of the front contact fingers 54 relative to the back contact fingers 44 so as to increase the amount of open surface area available for receiving radiation.

Referring now to FIGS. 7–10, yet another embodiment of the present invention is illustrated showing a variation of the interdigitated contact structure. As previously described, it is highly desirable to limit the amount of metallization structure at the top surface of the cells 32 of the device 30 in order to maximize the amount of surface area available to receive either thermal or solar radiation, depending on whether the device 30 in a solar photovoltaic or thermophotovoltaic cell. In this embodiment of the present invention, cells 32 are structured in a manner similarly described in the prior cells. The only difference is in the interdigitated interconnect structure. In this particular embodiment, a first cell 60 includes a plurality of front contact grid fingers 38 which are spaced from each other and interconnected in substantially perpendicular form to a front contact current collector 40 as described in the first embodiment of FIGS. 4–6. Likewise, a plurality of channels 42 are formed in the upper surface of the cell 60 so as to expose the back contact layer 18 at the bottom surface 43 thereof, again similar to the embodiment illustrated in FIGS. 4–6.

Figure 8:
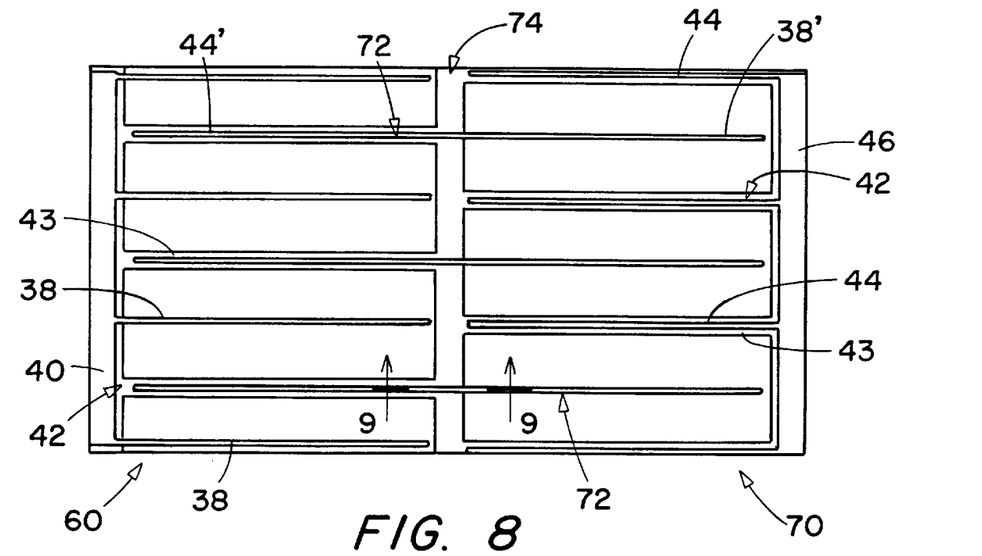
FIG. 8 is a top plan view of a second embodiment of the invention showing an alternate interconnect structure for the interdigitated front-back connect arrangement of the present invention.
Figure 9:
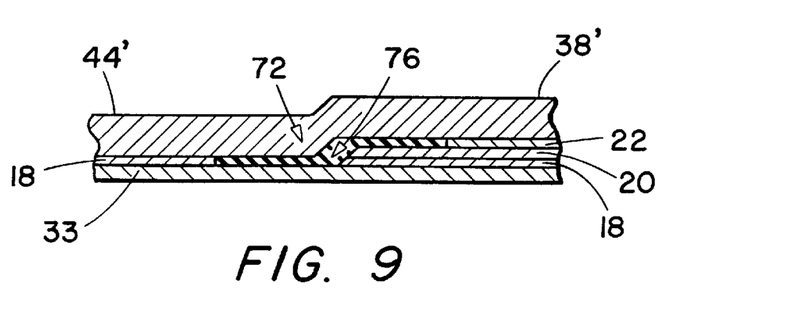
FIG. 9 is a partial cross-sectional view of the interconnect grid finger arrangement taken substantially along 9—9 of FIG. 8.

Adjacent cell 70 also includes a plurality of channels 42 formed in the upper surface thereof similar to the channels 42 formed in the cell 60. Disposed in the center of the channels 42 of the cell 70 are a plurality of spaced back contact fingers 44 that are interconnected to a substantially perpendicular back contact current collector 46. The channels 42 of the first cell 60 include a plurality of grid finger interconnect members 72 which are disposed therein and are in contact with the back contact layer 18 in the channels 42. In this manner, the grid finger interconnects 72 function as the back contact fingers 44' of the cell 60. However, the grid finger interconnect members 72 pass through the cell interspace 74 and extend onto the emitter layer 22 of the adjacent cell 70 so as to form the front contact grid fingers 38' of the cell 70. The interspace 74 between the cells 60 and 70 includes an insulation layer 76 so as to prevent shorting of the grid interconnect 72 as it passes from the cell 60 to the cell 70. Thus, the interdigitated connection of this particular embodiment are the grid fingers interconnects 72 themselves which also function as back contact fingers of one cell and front contact fingers of an adjacent cell. This interconnect arrangement may be continued from cell to cell through an indefinite number of cells.

Utilizing this particular embodiment of the present invention, the power density output of the power converter is increased because even less space is required for the interconnect between the cells 60 and 70. Additionally, this particular embodiment has even more enhanced reliability as compared to the prior bus bar interconnect embodiments of FIGS. 7–6 and 11–12, since only approximately 5–10% of the perimeter of the individual cells 60 and 70 is covered with metal utilizing this particular embodiment of the present invention. Total power losses of this particular embodiment including shadowing are less than those associated with the conventional 1 $cm^2$ bus bar design. The power losses are approximately 15% shadowing and less than 2% electrical, and this particular embodiment construction is completely scaleable meaning that the power losses are constant regardless of how big the complete structure 30 is. As previously indicated, there is no practical limit to the number of cells which may be interconnected using this grid finger interconnect design embodiment.

Figure 10:
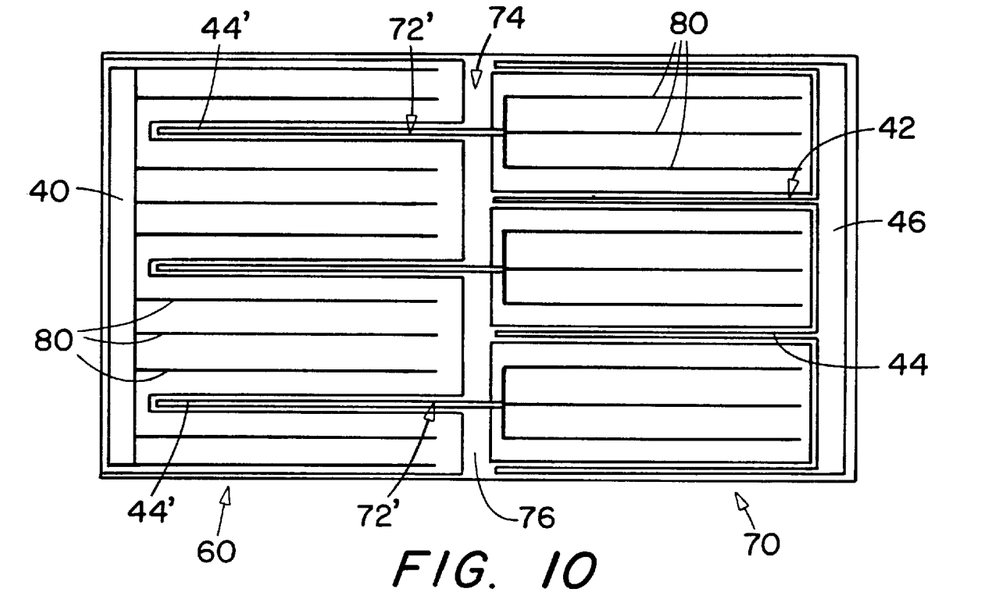
FIG. 10 is a top plan view illustrating yet a third embodiment of the invention showing yet another alternate interconnect structure for the interdigitated front-back connect arrangement of the present invention.

Referring to FIG. 10, still another embodiment is illustrated which is a variation of that just described in FIGS. 8 and 9. In this particular embodiment, the cell 60 includes a plurality of spaced channels 42 in which an interconnect member 72' is disposed to form a back contact finger 44' as previously discussed. The grid finger interconnect member 72' passes across the insulation 76 of the interspacing 74, as previously discussed, and into the cell 70. However, in this particular embodiment, the interconnect 72' is divided into a plurality of forked members 80 which are substantially thinner in size than the interconnect finger 72'. These form a plurality of spaced front contact members 80.

Thus, the forked front contact members 80 are disposed on the emitter layer 22 of the cell 70. Likewise, the front contact members of the cell 60 are in the form of a plurality of spaced forked members 80 wherein several members 80 are interspersed between spaced back contact members 44'. Thus, the embodiment illustrated in FIG. 10 is an asymmetric design for the grid interconnect finger arrangement as opposed to the symmetric design illustrated in FIG. 8. The advantage of this asymmetric design of FIG. 10 is that it allows flexibility in output and dimensions for the cells 60 and 70. Moreover, optical absorption is an issue in thermophotovoltaic converter design. Resistance loss between the spaced front contact members of the thermophotovoltaic cell is reduced when the spacing is reduced. Therefore, as the number of front contact members 80 are increased as compared to a single front contact finger 38', they are positioned closer together so as to reduce the space therebetween and thus reduce the resistance loss between the individual contact fingers.

The use of the interdigitated front-back contact grid structure of the present invention provides the freedom to design power conversion devices with a broad range of current voltage outputs. For example, a 1 $cm^2$ power conversion device constructed in accordance with the present invention can generate 12 V or even 16 V output. To produce a monolithically integrated thermophotovoltaic power conversion module in accordance with the present invention, insulating layers must be deposited between the individual cells in order to prevent short circuiting between the cells and allow the interconnect arrangement to function appropriately. Moreover, the channels or vias are preferably formed using etching procedures in order to position the back contact grid structure as discussed above. There are any number of possible deposition techniques and materials that can be used to form the insulating layers of a power conversion device. Spin on glass, e-beam deposited $SiO_2$ as well as CBD $Si_3N_4$ have all been used successfully for such purposes. A GaInAs MIM (monolithically integrated module) device may preferably be fabricated utilizing semiconductor materials having band-gaps ranging from approximately 0.74 eV–0.55 eV. The higher band-gap material, that is 0.74 eV, is preferably grown lattice matched to an InP substrate. The lower band-gap material is still preferably grown on an InP substrate, but the epitaxial layers are lattice mismatched in such an instance. Regardless of whether the material is lattice matched or mismatched, the interdigitated front-back interconnect structure of the present invention may be utilized.

A working, 2 cell GaInAs MIM device was fabricated in accordance with the present invention. Both a large (1 cm$^2$) and a small (0.12 cm$^2$) area device were constructed, each containing two cells interconnected monolithically utilizing the present invention on a semi-insulating inP substrate. These particular devices utilized the embodiment illustrated in FIGS. 4–6. The smallest cells fabricated had an individual cell width of over 2 mm. It is the cell width that is the critical parameter that differentiates the present invention from those devices which do not incorporate a back contact grid structure on the top surface. Efforts to fabricate MIM structures with a cell width of over 1 mm that are capable of sustaining required current densities have previously been unsuccessful up to the present invention. As previously pointed out, a primary benefit of the present invention is the ability of such photovoltaic power conversion devices to sustain high current densities needed for thermophotovoltaic applications.

Figure 13:
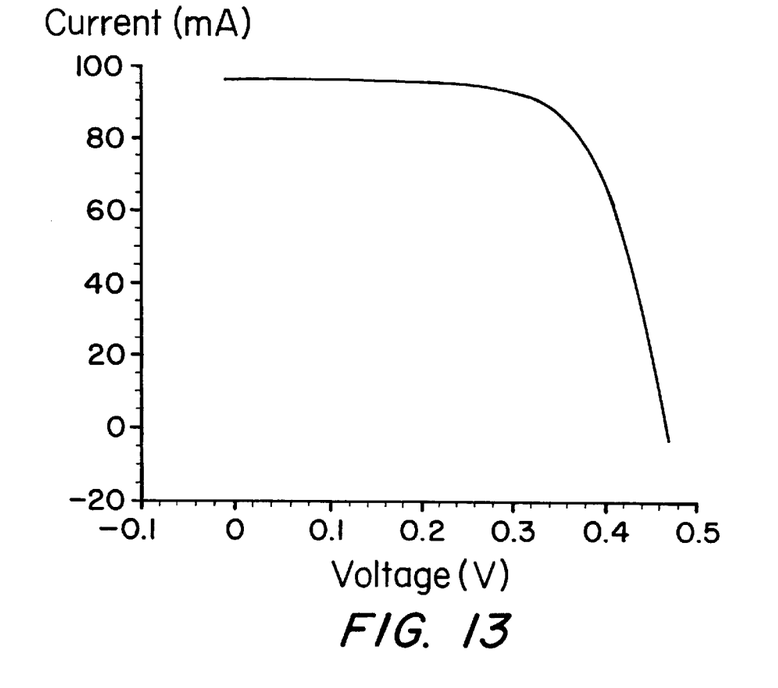
FIG. 13 is a graph illustrating the current vs. voltage relationship of one cell constructed in accordance with the present invention.

A single cell incorporating a lattice matched GaInAs structure as discussed above was grown on a semi-insulated InP substrate. It was processed utilizing the interdigitated grid design of FIGS. 4–6. The thermophotovoltaic cell was measured at the high intensity anticipated for the application of the present invention. The Voc was about 0.4684 V, with a cell current of 95.7 mA and a current density of 1495.3 mA/cm$^2$. Relatively high fill factors for this particular band-gap, i.e. 0.74 eV, proved that this particular embodiment was capable of operating under high intensity conditions without significant resistive power losses. This fill factor was in fact approximately 70%. FIG. 13 illustrates the output of this single cell.

Figure 14:
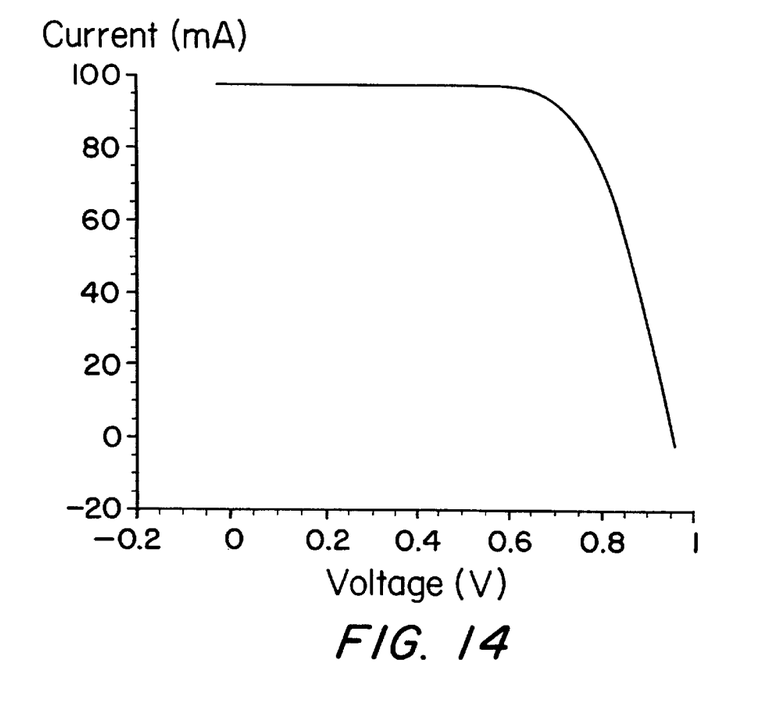
FIG. 14 is a graph illustrating the current vs. voltage relationship of a two cell power conversion device constructed using the present invention.

A MIM structure utilizing two cells, each one as described above, was formed with the cells being monolithically interconnected utilizing the front-back interdigitated structure of FIGS. 4–6. The Voc for this device was 0.9583 V with a current of 97.14 mA, a current density of 1518 mA/cm$^2$, and a fill factor of about 70%. The results of this particular device are illustrated in FIG. 14 and clearly show that multiple thermophotovoltaic cells utilizing the interdigitated grid design of the present invention and monolithically series connected, may be operated under high intensity illumination without suffering excessive series resistance losses.

Figure 15:
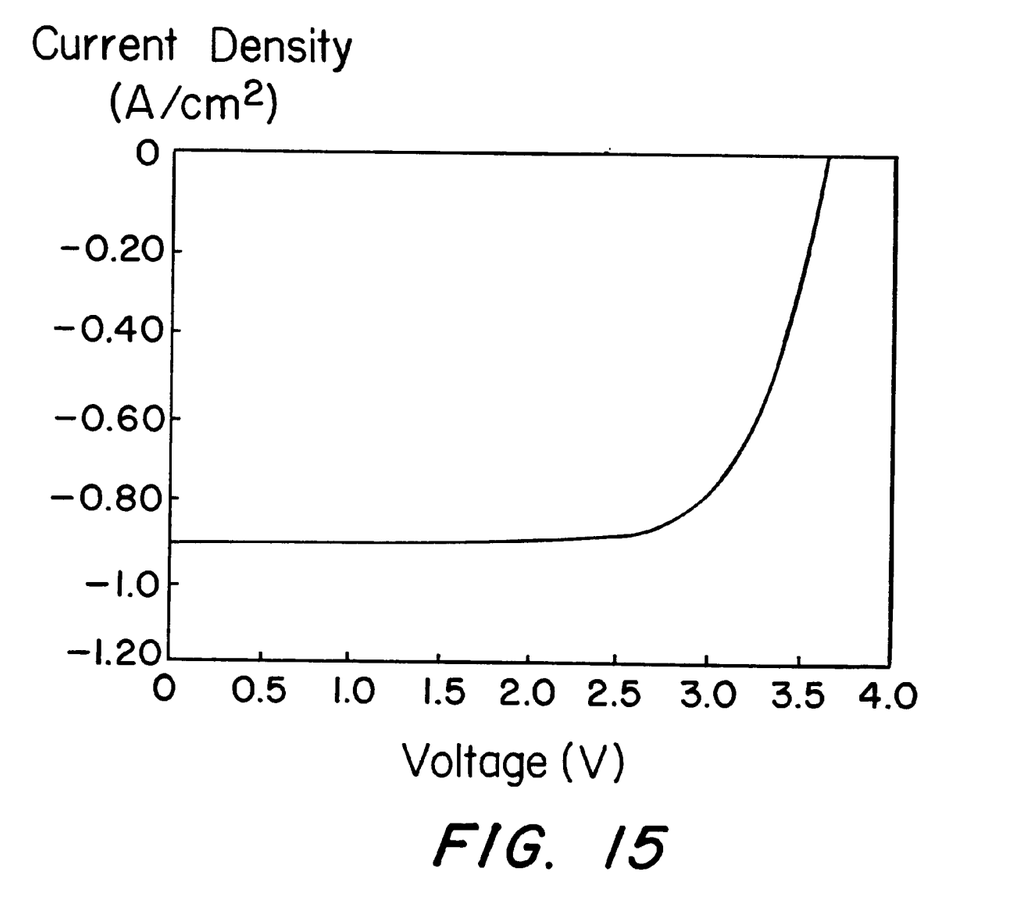
FIG. 15 is a graph illustrating the current density vs. voltage relationship of an eight cell power conversion device using the present invention.

Utilizing the front-back interdigitated grid finger embodiment of FIGS. 8 and 9, a MIM structure having eight cells was formed. Each of the cells incorporated a lattice matched GaInAs structure grown on a semi-insulated InP substrate. The eight cells were monolithically interconnected utilizing the grid finger interconnects as described with FIGS. 8 and 9. The Voc for this device was 3.62 V with a current density of 0.9 A/cm$^2$ and a fill factor of over 72%. The output results of this device are illustrated in FIG. 15, which clearly show the successful implementation of this arrangement.

As can be seen from the above, the present invention provides a photovoltaic power conversion device having both front and back contact structures disposed at the top surface thereof yet allow high current densities and voltage outputs. The present invention permits interdigitated series connection between a plurality of individual cells to provide voltage outputs of any desired amount for a single device. Moreover, the present invention reduces the resistance of the current flow in the cells while enhancing the output properties. Finally, the present invention enables a designer of photovoltaic cells to maximize the top surface exposure of the cells to either thermal or solar radiation while benefiting from utilizing top surface interconnects for both front and back contacts.

The foregoing description and the illustrative embodiments of the present invention have been described in detail in varying modifications and alternate embodiments. It should be understood, however, that the foregoing description of the present invention is exemplary only, and that the scope of the present invention is to be limited to the claims as interpreted in view of the prior art. Moreover, the invention illustratively disclosed herein suitably may be practiced in the absence of any element which is not specifically disclosed herein.

We claim:

1. A photovoltaic power conversion device having a front-back interdigitated contact arrangement and a top surface adapted to receive impinging radiation, said device comprising:

at least two adjacent, serially connected cells, each cell including a semi-insulating substrate, a lateral conductivity or back layer of a first doped electrical conductivity disposed on said substrate, a base layer disposed on said lateral conductivity or back layer and having the same electrical conductivity thereof, an emitter layer of a second doped electrical conductivity of opposite electrical charge disposed on said base layer and forming a p-n junction therebetween, and a plurality of spaced channels formed in said emitter and base layers to expose said lateral conductivity or back layer at the bottoms thereof;

a front contact grid positioned on the top surface of said emitter layer of each said cell;

a front current collector means positioned along one outside edge of at least one first cell;

a back contact grid positioned in said channels of each said cell at the top surface of said device for engagement with said lateral conductivity or back layer;

a back current collector means positioned along at least one outside edge of at least one oppositely disposed second cell; and interdigitation means serially connecting said front contact grid of one cell to said back contact grid of an adjacent cell at the top surface of said device through an interconnect that contacts and electrically connects said front current collector with said back current collector as a bridge so that a majority of the surface area of each cell remains exposed to receive impinging radiation.

2. The device as claimed in claim 1, wherein each said cell includes a first current collection means positioned along one edge of said cell interconnected to said front contact grid, and a second current collector means positioned along a second edge of said cell opposite said first edge and interconnected to said back contact grid.

3. The device as claimed in claim 2, wherein said interdigitation means comprises electrical insulation means disposed between adjacent cells, and a bridge member interconnecting a first current collector means of one cell with a second current collector means of an adjacent cell to serially connect said front and back contact grids of the cells of said device at the top surface of said device.

4. The device as claimed in claim 2, wherein said front contact grid comprises a plurality of spaced metal fingers interspersed between said channels and extending substantially perpendicular to said first current collector means, and said back contact grid comprises a plurality of spaced metal fingers positioned in said channels and extending substantially perpendicular to said second current collector means.

5. The device as claimed in claim 2, wherein said back contact grid of each said cell comprises a plurality of spaced metal fingers positioned in said channels and extending substantially perpendicular to said second current collector means, and wherein said first contact grid of each cell comprises a plurality of spaced metal fingers extending substantially perpendicular to a first current collector means, each said front contact grid finger being positioned immediately above one said back contact grid finger in a stacked manner and bridging said channel on either side thereof to engage the emitter layer on each side of said channel, there being a layer of insulating material interposed between the stacked front and back contact fingers to provide electrical insulation therebetween.

6. The device as claimed in claim 5, wherein said interdigitation means comprises electrical insulation means disposed between adjacent cells, and a bridge member interconnecting a first current collector means of one cell with a second current collector means of an adjacent cell to serially connect said front and back contact grids of the cells of said device at the top surface of said device.

7. The device as claimed in claim 1, wherein said front contact grid comprises a plurality of spaced metal fingers interspersed between said channels, said front contact fingers of said first cell extending substantially perpendicular to said first current collector means, and said back contact grid comprises a plurality of spaced metal fingers positioned in said channels, said back contact fingers of the last cell extending substantially perpendicular to said second current collector means, and wherein said interdigitation means comprises a plurality of grid fingers interconnecting the lateral conductivity layer of one cell with the emitter layer of an adjacent cell while providing electrical insulation therebetween.

8. The device as claimed in claim 7, wherein said plurality of interconnecting grid fingers are positioned onto said lateral conductivity layer in the spaced channels interposed between said front contact grid fingers on the first cell to form the back contact grid of said first cell, and are further positioned onto the surface of said emitter layer interposed between said back contact grid fingers on said adjacent second cell to form the front contact grid of said second cell, said spaced metal interconnect grid fingers being disposed on an insulating substrate layer between said first and adjacent second cells to prevent shorting of said grid interconnect fingers.

9. The device as claimed in claim 8, wherein the grid interconnect fingers forming the front contact grid of said second cell are each subdivided to form a plurality of forked finger contact members extending the length of said cell between said spaced channels, said forked finger contact members being joined to said grid finger interconnect immediately adjacent said insulating layer.

10. The device as claimed in claim 8, wherein said device includes a plurality of serially connected cells, each said cell being interconnected to adjacent cells with interconnecting grid fingers, the first cell including said first current collector means and the last of said plurality of cells including said second current collector means.

11. The device as claimed in claim 1, wherein said device includes a plurality of cells serially connected to each other, said first current collection means being disposed along one outside edge of at least the first of said plurality of cells, and said second current collections means being disposed along one outside edge of at least the last of said serially connected plurality of cells.

12. A thermophotovoltaic power conversion device having a front back interdigitated contact arrangement and a top surface adapted to receive radiant energy and a semi-insulating substrate disposed on a back surface reflector layer, said device comprising:

a plurality of serially interconnected cells spaced along said substrate, each said cell including said back surface reflector layer, said semi-insulating substrate, a back contact layer doped to create the first electrical conductivity charge, a base layer disposed on said back contact layer and doped to carry the same first electrical conductivity charge thereof, an emitter layer disposed on said base layer and doped to create a second electrical conductivity charge opposite said first electrical conductivity charge and creating a p-n junction therebetween, and a plurality of spaced channels formed in said emitter and base layers to expose said back contact layer at the bottoms thereof;

a front contact grid positioned on the top surface of said emitter layer of each said cell;

a front current collector bar positioned along one outside edge of at least the first of said plurality of cells;

a back contact grid positioned in said channels on said back contact layer of each said cell;

a back current collector bar positioned along at least one outside edge of at least the last of said plurality of cells; and interdigitation means serially connecting said front contact grid of one cell to said back contact grid of an adjacent cell at the top surface of said device through interconnects that contacts and electrically connects said front current collector with said back current collector as a bridge to serially interconnect all of said plurality of cells to increase the amount of open surface area available for receiving radiation.

13. The device as claimed in claim 12, wherein each said cell includes a first and a second current collection bar disposed on opposite edges thereof, wherein said front contact grid includes a plurality of spaced metal fingers interspersed between said channels and extending substantially perpendicular to interconnect with said first current collector bar, wherein said back contact grid includes a plurality of spaced metal fingers positioned in said channels extending substantially perpendicular to interconnect with said second current collector bar, and wherein said interdigitation means comprises electrical insulation means disposed between adjacent cells and a bridge member interconnecting a first current collector bar of one cell with a second current collector bar of an adjacent cell to serially connect said front and back contact grids of said plurality of cells at the top surface of said device.

14. The device as claimed in claim 12, wherein each said cell includes a first and a second current collection bar disposed on opposite edges thereof, wherein said back contact grid of each said cell includes a plurality of spaced metal fingers positioned in said channels and extending substantially perpendicular to interconnect with said second current collector bar, wherein said first contact grid of each said cell comprises a plurality of spaced metal fingers extending substantially perpendicular to interconnect with said first current collector bar, each said front contact grid finger being positioned immediately above one said back contact grid fingers in a stacked manner and bridging said channel on either side thereof to engage said emitter layer on each side of said channel, there being a layer of insulating material interposed between the stacked front and back contact fingers to provide electrical insulation therebetween, and wherein said interdigitation means comprises electrical insulation means disposed between adjacent cells, and a bridge member interconnecting a first current collector bar of one cell with a second current collector bar of an adjacent cell to serially connect said front and back contact grids of said plurality of cells at the top surface of said device.

15. The device as claimed in claim 12, wherein said front contact grid comprises a plurality of spaced metal fingers interspersed between said channels on each said cell, said front contact fingers of the first of said plurality of cells extending substantially perpendicular to said first current collector bar, wherein said back contact grid comprises a plurality of spaced metal fingers positioned in said channels wherein said back contact fingers of said last of said plurality of cells extend substantially perpendicular to said second current collector bar, and wherein said interdigitation means comprises a plurality of grid interconnect fingers interconnecting the back contact layer of one cell with the emitter layer of an adjacent cell while providing electrical insulation between said cells.

16. The device as claimed in claim 15, wherein said plurality of grid interconnect fingers are positioned onto said back contact layer in the spaced channels interposed between said front contact grid fingers on one cell to form the back contact grid of that same cell, and are further positioned onto the surface of said emitter layer interposed between said back contact grid fingers on said adjacent cell to form the front contact grid of said adjacent cell, said spaced metal grid interconnect fingers being disposed on an insulating substrate layer between said cells to prevent shorting of said grid interconnect fingers.

17. The device as claimed in claim 16, wherein the grid interconnect fingers forming the front contact grid of a cell are each subdivided to form a plurality of forked finger contact members extending the length of the cell between said spaced channels.

18. In a photovoltaic power conversion device having front-back interdigitated front-back contact grid arrangement and a top surface adapted to receive impinging radiation and including at least two adjacent, serially connected cells each having a semi-insulating substrate, a back conductivity layer disposed on said substrate and doped to create a first electrical charge, a base layer disposed on said back conductivity layer and having the same electrical charge thereof, and an emitter layer disposed on said base layer and doped to create a second, opposite electrical charge forming a p-n junction therebetween, the improvement comprising:

a plurality of spaced channels formed in the emitter and base layers of each said cell to expose the back conductivity layer at the bottoms thereof;

a plurality of front contact fingers disposed along the top surface of said emitter layer of each said cell and spaced between said channels;

a front contact current collector bar disposed along one side edge of at least one first cell;

a plurality of back contact fingers disposed on the back conductivity layer in said channels of each said cell;

a back contact current collector bar disposed along one side edge of at least one second cell opposite said first cell; and interdigitated serially interconnecting means that function as back contact fingers of one cell and front contact fingers of an adjacent cell at the top surface of said device to provide increased power density output.

19. The improvement of claim 18, wherein each said cell includes a front contact and a back contact current collector bar disposed on opposite edges thereof, said front contact fingers extending substantially perpendicular from said front contact current collector bar and said back contact fingers extending substantially perpendicular from said back contact current collector bar, and wherein said interdigitation means comprises electrical insulation means disposed between adjacent cells and a bridge member interconnecting a front contact current collector bar of one cell with a back contact current collector bar of an adjacent cell to serially interconnect the front and back contact fingers of the cells of said device at the top surface of said device.

20. The improvement of claim 18, wherein each said cell includes a front and a back contact current collector bar disposed on opposite edges thereof, said back contact fingers positioned in said channels extending substantially perpendicular to said back contact current collector bar and said front contact fingers extending substantially perpendicular to said front contact current collector bar, each said front contact finger being positioned above one said back contact fingers in a stacked manner and bridging said channel on either side thereof to engage the emitter layer on each side of said channel, there being a layer of insulating material interposed between the stacked front and back contact fingers to provide electrical insulation therebetween.

21. The improvement of claim 18, wherein said interdigitation means comprises a plurality of grid interconnect fingers interconnecting the back conductivity layer of one cell with the emitter layer of an adjacent cell while providing electrical insulation therebetween, said grid interconnect fingers being positioned onto the back conductivity layer in the spaced channels on the first cell to form the back contact finger of said first cell while further being positioned onto the surface of said emitter layer interposed between said back contact grid fingers on said second cell to form the front contact fingers of said second cell.

22. The improvement of claim 18, wherein the first electrical charge is an n-type doped conductivity, while the second opposite electrical charge is a p-type doped conductivity.

23. A monolithically integrated thermovoltaic power conversion module having a front-back interdigitated contact arrangement and a top surface adapted to receive radiant energy; and module comprising:

a semi-insulating substrate disposed on a back surface reflector layer;

a plurality of serially interconnected cells spaced along and incorporated with said substrate, each said cell including a back contact lateral conductivity layer disposed on said substrate and doped to create a first electrical conductivity charge, a base layer disposed on said back contact layer and doped to carry the same first electrical conductivity charge thereof, an emitter layer disposed on said base layer and doped to create a second electrical conductivity charge opposite said first electrical conductivity charge to create a p-n junction therebetween, and a plurality of spaced channels formed in said emitter and base layers to expose said back contact lateral conductivity layer at the bottoms thereof;

a plurality of front contact fingers disposed along the top surface of said emitter layer of each said cell and spaced betweens said channels;

a plurality of back contact fingers disposed on the back contact lateral conductivity layer in the channels of each said cell;

a front contact current collector bar disposed along one side edge of the first of said plurality of cells and interconnected to the front contact fingers of said first cell;

A back contact current collector bar disposed along one side edge of the last of said plurality of cells and interconnected to the back contact fingers of said last cell; and interdigitation means serially interconnecting the emitter layer of one cell to the back contact lateral conductivity layer of an adjacent cell.

24. The module of claim 23, wherein said interdigitation means comprises a plurality of spaced metal grid fingers interconnecting the emitter layer of one cell with the back contact lateral conductivity layer of the adjacent cell while providing electrical insulation therebetween.

25. The module of claim 24, wherein said plurality of spaced interconnecting metal grid fingers are positioned onto said back contact lateral conductivity layer in the spaced channels of said first cell to form the back contact fingers of said first cell, and are further positioned onto the surface of said emitter layer interposed between said back contact grid fingers of an adjacent cell to form the front contact fingers of said adjacent cell, said spaced metal interconnecting grid fingers being disposed on an insulating substrate layer between said adjacent cells to prevent shorting of said grid fingers.

26. The module of claim 25, wherein said interconnecting grid fingers forming said front contact fingers of any cell are subdivided to form a plurality of forked fingered contact members extending the length of said cell between said spaced channels, said forked fingers contact members being joined to said grid finger interconnect immediately adjacent said insulating substrate layer.

27. The module of claim 23, wherein said back contact lateral conductivity layer comprises an n-type conductivity, said base layer comprises an n-type conductivity, said emitter layer comprises a p-type conductivity.

* * * * *